(12) United States Patent
Peng et al.

(10) Patent No.: US 7,907,465 B2
(45) Date of Patent: Mar. 15, 2011

(54) ELECTRICALLY PROGRAMMABLE FUSE BIT

(75) Inventors: Jack Z. Peng, San Jose, CA (US); David Fong, Cupertino, CA (US); Glen A. Rosendale, Palo Alto, CA (US)

(73) Assignee: Kilopass Technology, Inc., Santa Clara, CA (US)

( * ) Notice: Subject to any disclaimer, the term of this patent is extended or adjusted under 35 U.S.C. 154(b) by 0 days.

(21) Appl. No.: 12/577,084

(22) Filed: Oct. 9, 2009

(65) Prior Publication Data

US 2010/0091545 A1 Apr. 15, 2010

Related U.S. Application Data

(62) Division of application No. 11/699,916, filed on Jan. 29, 2007, now Pat. No. 7,609,539.

(60) Provisional application No. 60/763,016, filed on Jan. 27, 2006.

(51) Int. Cl.
*G11C 17/18* (2006.01)
*G11C 17/00* (2006.01)
*H01H 85/00* (2006.01)

(52) U.S. Cl. ........ 365/225.7; 365/96; 365/104; 327/525

(58) Field of Classification Search ................. 365/225.7
See application file for complete search history.

(56) References Cited

U.S. PATENT DOCUMENTS

| | | | |
|---|---|---|---|
| 6,038,170 A | 3/2000 | Shiba | |
| 6,130,834 A * | 10/2000 | Mullarkey et al. | 365/96 |
| 6,392,468 B1 | 5/2002 | Wu | |
| 6,421,293 B1 * | 7/2002 | Candelier et al. | 365/225.7 |
| 6,525,955 B1 * | 2/2003 | Smith et al. | 365/96 |
| 6,580,144 B2 | 6/2003 | Anthony | |
| 6,630,724 B1 | 10/2003 | Marr | |
| 6,650,143 B1 | 11/2003 | Peng | |
| 6,674,670 B2 | 1/2004 | Jeung | |
| 6,879,519 B1 | 4/2005 | Yip | |
| 6,927,997 B2 | 8/2005 | Lee et al. | |
| 7,102,951 B2 | 9/2006 | Paillet et al. | |
| 7,609,539 B2 | 10/2009 | Peng et al. | |
| 7,663,955 B2 * | 2/2010 | Miller | 365/207 |
| 7,768,831 B2 * | 8/2010 | Byeon et al. | 365/185.09 |
| 2002/0126531 A1 | 9/2002 | Hosono et al. | |
| 2004/0156234 A1 | 8/2004 | Peng et al. | |
| 2005/0286337 A1 * | 12/2005 | Louie et al. | 365/232 |
| 2007/0183244 A1 * | 8/2007 | Lee | 365/225.7 |
| 2008/0061866 A1 * | 3/2008 | Chen et al. | 327/525 |

OTHER PUBLICATIONS

International Search Report and Written Opinion, International Application No. PCT/US2007/61233, Filed on Jan. 29, 2007, Applicant: Kilopass Technology, Inc., Date of Mailing: Feb. 14, 2008, 2 pages.
European Search Report, European Application No. EP 07710366.1, Filed on Jan. 29, 2007, Applicant: Kilopass Technology, Inc., Date of Mailing Apr. 3, 2009, 6 pages.

* cited by examiner

*Primary Examiner* — Son L Mai
(74) *Attorney, Agent, or Firm* — Perkins Coie LLP (57) ABSTRACT

One-time programmable (OTP) nonvolatile fuse memory cells are disclosed that do not require decoding or addressing for reading their data content. Each fuse memory cell has its content latched at its output and available at all times and can be used, for example, for code storage memories, serial configuration memories, and as individual fuse bits for ID (identification), trimming, and other post-fabrication System-on-Chip (SoC) customization needs. Means are also provided for temporary data storage for design testing, etc. In alternative embodiments, using two differentially programmed fuses in a single memory cell, the selection and programming circuitry are merged.

11 Claims, 8 Drawing Sheets

Sample Fuse Circuit

Figure 4: Fuse-Block

Figure 5A: Fuse Program Timing

Figure 5B: Fuse Program Timing

Figure 6: Programming/Verifying Timing

Figure 7: SET and RESET Timing

Figure 8: Sample Fuse Circuit

Figure 9: Differential Fuse Bit Circuit

Figure 10: Alternate Differential Fuse Bit Circuit

Figure 11: Fuse transistor showing Source & Drain diodes (with & without Cascode Protection Transistor)

Figures 12A and 12B: NWELL BV$_J$ Improvement (2 options) cascading not shown

NWELL OPTION 1

NWELL OPTION 2

Figure 13: NATIVE BV$_J$ Improvement

ELECTRICALLY PROGRAMMABLE FUSE BIT

CROSS-REFERENCE TO RELATED APPLICATION(S)

This application is a divisional application of U.S. patent application Ser. No. 11/699,916, filed Jan. 29, 2007, now U.S. Pat. No. 7,609,539 which claims the benefit of U.S. Provisional Application No. 60/763,016, entitled "Electrically Programmable Fuse Bit," filed Jan. 27, 2006, each of which are incorporated herein by reference in their entireties.

TECHNICAL FIELD

The embodiments described below relate generally to the field of one-time programmable (OTP) non-volatile memory cells and more particularly to CMOS implementation of a self-sensing non-volatile OTP fuse element.

BACKGROUND

Nonvolatile memory retains stored data when power is removed, which is desirable in many different types of electronic devices. One commonly available type of nonvolatile memory is the programmable read-only memory ("PROM"), which uses wordline-bitline crosspoint elements such as fuses, anti-fuses, and trapped charge devices such as the floating gate avalanche injection metal oxide semiconductor ("FAMOS") transistor to store logical information. The term "crosspoint" refers to the intersection of a bitline and a wordline.

An example of one type of PROM cell that uses the breakdown of a silicon dioxide layer in a capacitor to store digital data is disclosed in U.S. Pat. No. 6,215,140 to Reisinger et al. The basic PROM disclosed by Reisinger et al. uses a series combination of an oxide capacitor and a junction diode as the crosspoint element. An intact capacitor represents the logic value 0, and an electrically broken-down capacitor represents the logic value 1. The thickness of the silicon dioxide layer is adjusted to obtain the desired operation specifications.

Improvements in the various processes used for fabricating the different types of nonvolatile memory tend to lag improvements in widely used processes such as the advanced CMOS logic process. For example, processes for flash EEPROM devices tend to use 30% more mask steps than the standard advanced CMOS logic processes. These processes are for producing the special regions and structures required for the high voltage generation circuits, the triple well, the floating gate, the ONO layers, and the special source and drain junctions typically found in such devices.

Accordingly, processes for flash devices tend to be one or two generations behind the standard advanced CMOS logic processes and about 30% more expensive on a cost-per-wafer basis. As another example, processes for antifuses, which must be suitable for fabricating various antifuse structures and high voltage circuits, also tend to be about one generation behind the standard advanced CMOS processes. These examples indicate several disadvantages with the prior art memory technologies.

DETAILED DESCRIPTION

The embodiments explained in this description disclose one-time programmable (OTP) nonvolatile fuse memory cells, which do not require decoding or addressing for reading their data content. The disclosed fuse memory cells occupy small areas and are optimized for low bit count applications. Each fuse memory cell has its content latched at its output, and available at all times. These memory cells can be used for code storage memories, serial configuration memories, and as individual fuse bits for ID (identification), trimming, and other post-fabrication System-on-Chip (SoC) customization needs.

In general, to program one of these memory cells, a high voltage is applied to a specific transistor of the memory cell to break down the transistor (blow the fuse). For reading the fuse memory cell, the current passing through the transistor is sensed. The current passing through the fuse is an indication of its data content, a "1" or a "0," depending on the agreed convention.

Figure 1:
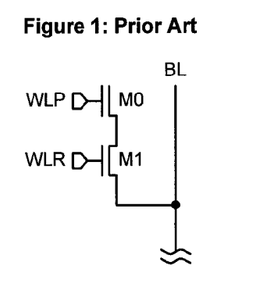
FIG. 1 illustrates a prior art memory cell.

The basic building block of the disclosed fuse memory cells is similar to the XPM memory cell of Kilopass Technologies, Inc. in Santa Clara, Calif., which is illustrated in FIG. 1. The fuse memory cell of FIG. 1 includes a "select" transistor M1 and a programming transistor M0, both of which can be fabricated using standard CMOS processes without additional masking. In this memory cell, transistor M1 acts as a switch and M0 acts as a current limiter, wherein the current passing through M0 is an indication of its programmed logic level (data content).

The gate of the programming transistor M0 acts as one plate of a capacitor and the application of the voltage to the gate causes an inversion layer to form under the gate which acts as the other plate of the capacitor, and together with the source/drain region forms the second terminal of the capacitor. Since it is undesirable to break down the gate oxide of the select transistor M1, the gate oxide of the select transistor M1 may be made, in some embodiments, to have a thicker gate oxide than that of the programming transistor M0.

For programming the memory cell of FIG. 1, WLP is elevated to VPP (a predetermined high voltage), WLR is turned ON, and the BL is grounded, for a specified duration of time (e.g., 50 us), to break down the gate oxide of the programming transistor M0. This arrangement sets the leakage current level of the memory cell and, therefore, its logic level.

For reading the content of the memory cell, appropriate voltage(s) is applied to the gates of M0 and M1 transistors, which connects M0 to the bit-line BL. Thereafter, to classify the logic level of the memory cell, the current passing through M1 and BL, which is limited by M0, is sensed by a sense amplifier.

Various embodiments of the invention will now be described. The following description provides specific details for a thorough understanding and enabling description of these embodiments. One skilled in the art will understand, however, that the invention may be practiced without many of these details. Additionally, some well-known structures or functions may not be shown or described in detail, so as to avoid unnecessarily obscuring the relevant description of the various embodiments.

Figure 2:
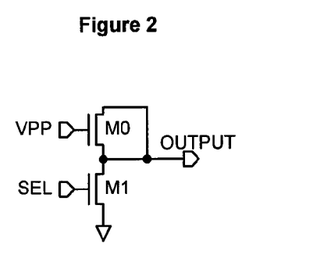
FIG. 2 illustrates a fuse memory cell, in accordance with an embodiment of the invention.

While the standard XPM memory cell, illustrated in FIG. 1, has no contact on the node between the programming transistor M0 and the select transistor M1, the fuse memory cell, illustrated in FIG. 2, connects to this node in order to provide a "self-sensing" voltage level. The "self-sensing" and the latching of the output of the fuse memory cells will be discussed in more detail. This configuration does not require a sense amplifier. In addition, the fuse memory cell may be designed using standard logic design rules. In the embodiment of FIG. 2, or in any other disclosed embodiment, the programming transistor M0 may be configured to use the capacitance between its source and its gate, its drain and its gate, or its source and drain and its gate to implement a fuse.

Figure 3:
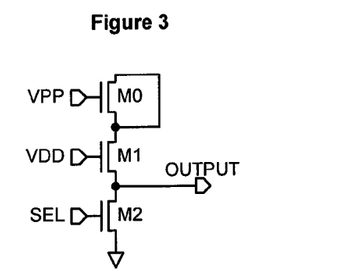
FIG. 3 illustrates a fuse memory cell with a high-voltage protection transistor, in accordance with another embodiment of the invention.

In FIG. 3, which illustrates a fuse memory cell with at least one high-voltage protection transistor M1, provides the cascade protection for the thin oxide M2 during the programming of the fuse transistor M0. In the circuit of FIG. 3, similar to the circuit of FIG. 2, the output is taken from a point between M0 and M1 transistors.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section.

Multi-Bit Memory Implementations

Figure 4:
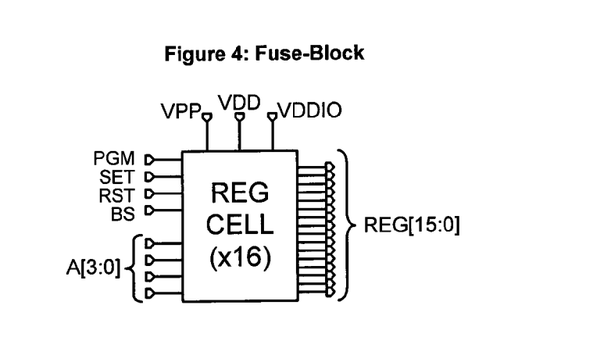
FIG. 4 is a high level block diagram of a 16-bit fuse-block using fuse memory cells, in accordance with an alternative embodiment of the invention.

In an exemplary multi-bit memory embodiment, the fuse circuit consists of a cascadeable 16-bit fuse memory block ("fuse-block"), illustrated by the high level diagram of FIG. 4. Each fuse-block has a PGM input pin that is used to program the fuse memory cells of that particular fuse-block. Furthermore, to program the fuse memory cells of the fuse-block, each fuse-block has an addressing circuit that employs the A[3:0] input pins. The PGM input pin allows for the cascading of multiple fuse-blocks with the ability to program any fuse memory cell within any fuse-block. The 16 output pins of each fuse-block, REG[15:0], are the latched outputs of the 16 memory bits (fuse memory cells) of the fuse-block. While this example describes a 16-bit fuse memory block, other data word widths (e.g. 1, 4, 8, 32, etc.) are extensions of this example.

Fuse Memory Block Programming Operation

Figure 5A:
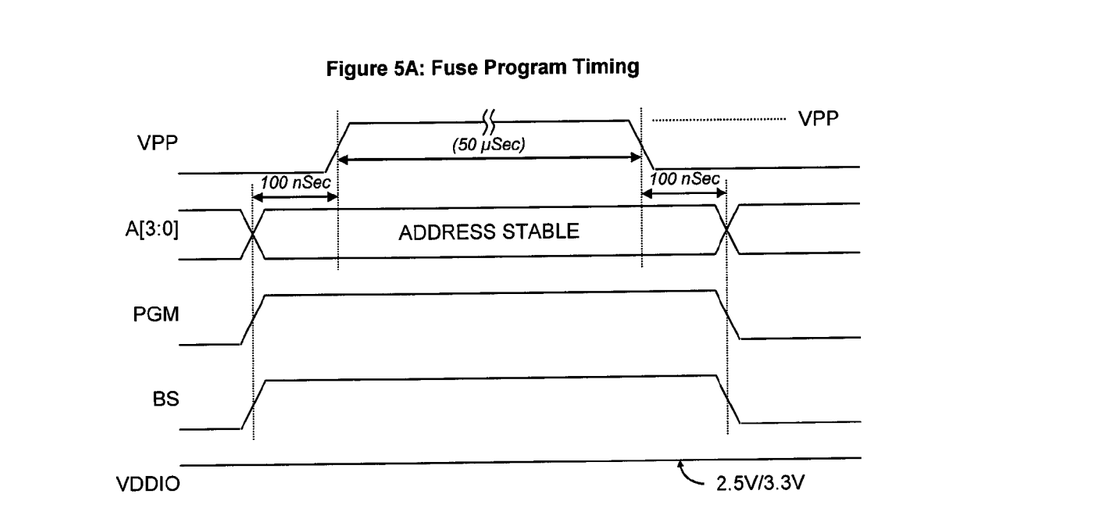
FIG. 5A is a timing diagram for fuse programming of the fuse-block of FIG. 4.
Figure 5B:
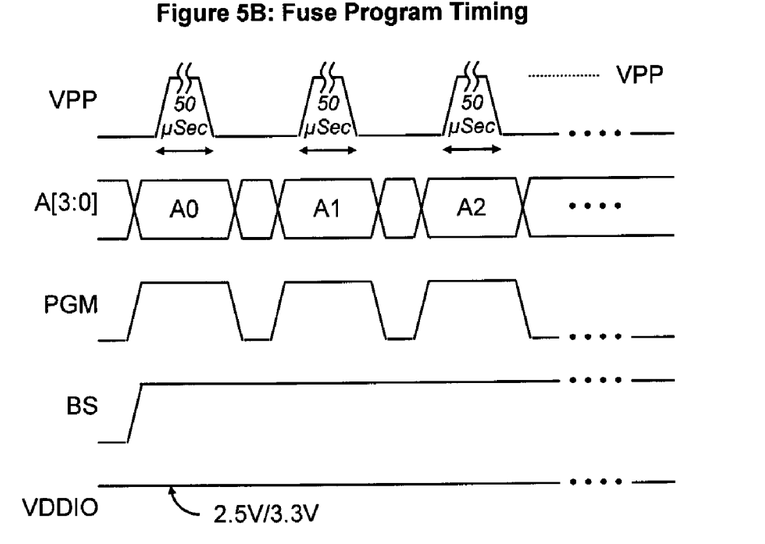
FIG. 5B is a timing diagram for sequential fuse programming for the fuse-block of FIG. 4.

The fuse memory block is programmed one fuse memory cell at a time by pulsing the "PGM" and VPP pins for $t_{PGM}$ seconds (e.g., 50 μSec) while asserting the selected fuse address on the A[3:0] pins and the block select pin BS, which enables operational access to a single fuse of the fuse-block. Note that, physically, programming a memory cell means blowing its fuse or breaking down a particular transistor. The VPP pin also provides the actual per-fuse programming timing, while the PGM pin has setup and hold requirements that depend on the VPP voltage values. An example of the VPP voltages for different process nodes is depicted in Table 1 and the corresponding program timing diagrams are illustrated by FIG. 5A. Using these program timings makes it possible to program several fuse memory cells sequentially, as shown in FIG. 5B.

TABLE 1

VPP vs. Process Node

| Node | VPP |
|---|---|
| 0.35 μm | 16 v |
| 0.25 μm | 13 V |
| 0.18 μm | 8.5 V |
| 0.15 μm | 7.5 V |
| 0.13 μm | 6.5 V |
| 90 nm | 6.0 V |

Program Verifying Operation

While it may not be possible to directly read a memory fuse cell output during a programming process, it may be desirable to test a fuse memory cell to make sure it has been properly programmed. In such a case, a method is needed to verify whether the memory cell fuse has been properly blown or not. Therefore, after programming, the current ($I_{READ}$) into the fuse is monitored to determine whether or not the programming was successful. For this purpose, a tester such as the wafer-level testers may be employed.

Because, in this example, there is no dedicated verify-mode-pin, the VPP pin is used at a lower voltage, as follows:
VPP Pin≧VPP voltage (see Table 1): Program Mode
VPP Pin≧VDDIO but≦VPP voltage: Verify Mode
VPP Pin=VDDIO: Fuse Read Mode (Normal Operation)

Figure 6:
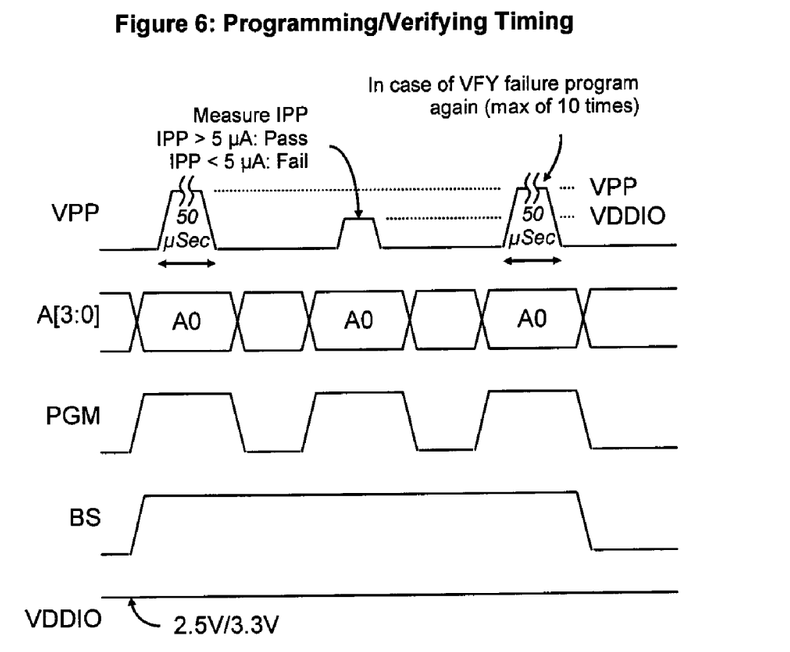
FIG. 6 is a programming and verifying timing diagram for a fuse memory cell.

FIG. 6 illustrates a timing diagram for a PGM/Verify cycle of fuse "0," which is the fuse addressed by A[3:0]=A0. Thus, the current that is drawn into the VPP Pin, and that passes through the programmed transistor M0, is measured to determine if in fact the fuse memory cell has been programmed as desired.

SET and RESET Operations

Figure 7:
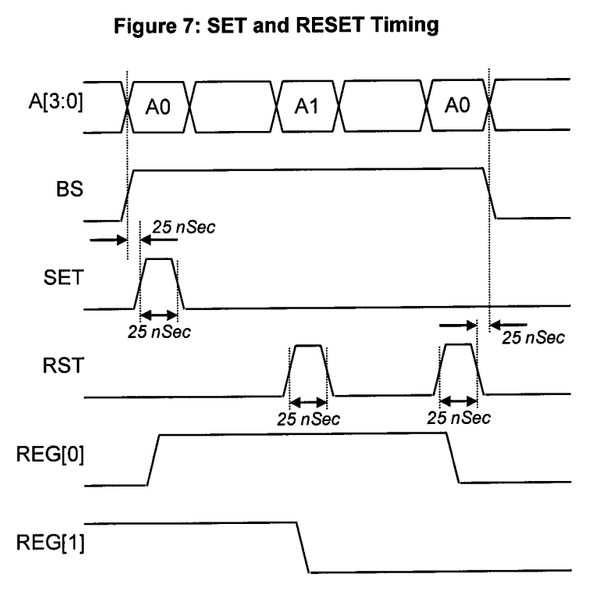
FIG. 7 is a SET and RESET timing diagram.

It may be desirable, for example during prototyping or program verification, to temporarily program a fuse memory cell without blowing its fuse. The SET and RESET lines available in some embodiments of the fuse-block allow temporarily storing data into a fuse memory cell latch without permanently programming its fuse, and making the data available at the memory cell's output. The fuse memory block allows individual SET and RESET options of each fuse memory cell latch to be used for testing of functionality and to override the latch content. The required timing is shown in FIG. 7.

Figure 8:
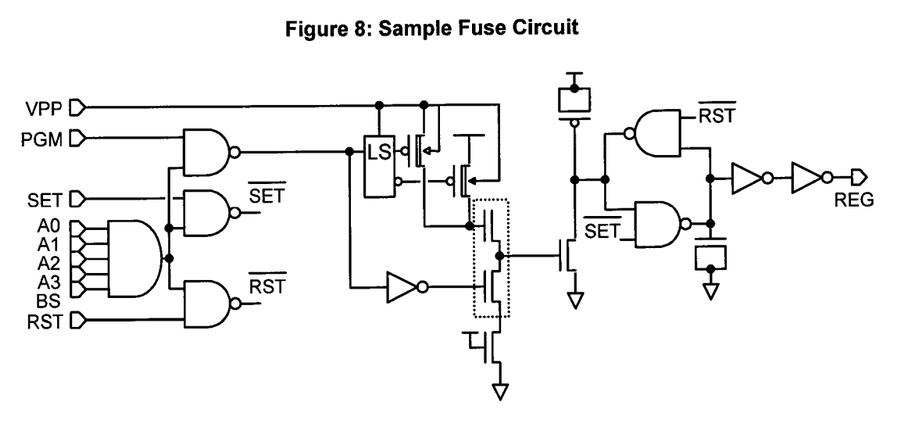
FIG. 8 illustrates an internal circuitry of a fuse memory cell.

FIG. 8 depicts, in greater detail, an example of the latching of the output of fuse M0 by two cross-coupled NAND-gates A1 and A2, and the possibility of manipulating the latch by the SET and RESET signals.

Fuse Memory Cell Circuit Details

FIG. 8 illustrates the circuitry of an embodiment of a fuse memory cell. In the circuit of FIG. 8, an individual fuse M0 is selected by the combination of the address pins A[3:0], BS, and PGM for programming or verifying. The fuse which has been selected for programming or verifying has its high voltage supplied by the VPP pin after passing through an optional high-voltage level shifter circuit X6. The high-voltage level shifter X6 is provided to isolate a non-accessed fuse from the programming voltage when a different fuse in the same block is being programmed. Alternate embodiments of the invention omit the level shifter, as will be discussed below. In an alternative embodiment of this circuitry, the three-transistor memory cell is replaced by the two-transistor memory cell of FIG. 2.

FIG. 8 also illustrate the "self sensing" attribute of the disclosed embodiments, where the content of fuse M0 is latched at the output by the cross-coupled NAND-gates A1 and A2. When the fuse is programmed, the corresponding output value (REG) is static and does not need to be dynamically sensed.

Differential Fuse Circuits

Figure 9:
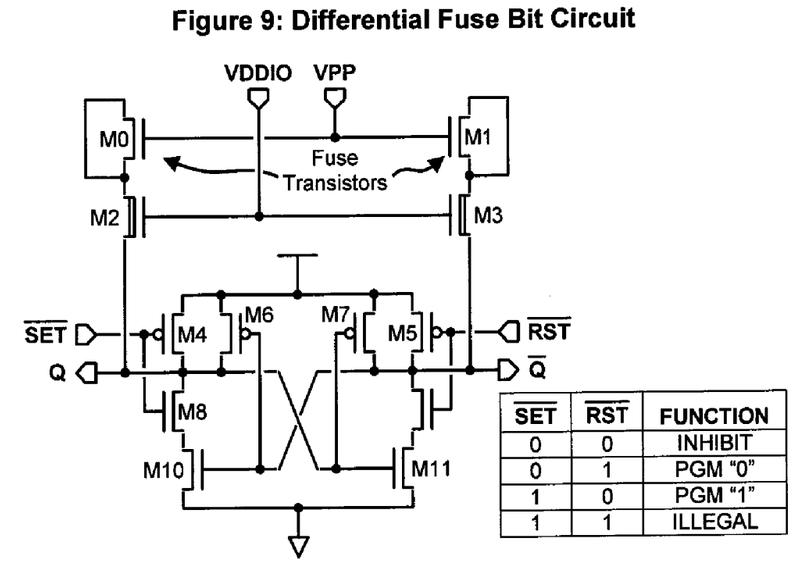
FIG. 9 illustrates a differential fuse memory cell circuit, in accordance with another embodiment of the invention.

In an alternative embodiment, by using two differentially programmed fuses in a single memory cell, it is possible to merge the selection and programming circuitry of FIG. 8. In addition, capacitors C1 and C2 can be eliminated, because differentially programmed fuse memory cells will always power up the latch to a valid state. FIG. 9 shows a circuit diagram of a differential fuse memory cell using the memory core shown in FIG. 1.

In this implementation a "SET" operation (i.e. $\overline{SET}$=0) on an un-programmed fuse memory cell will result in a "Q" output of logic "0" after a program operation, and a "RESET" operation (i.e. $\overline{RST}$=0) on an un-programmed fuse memory cell will result in a "Q" output of logic "1" after a program operation.

Figure 10:
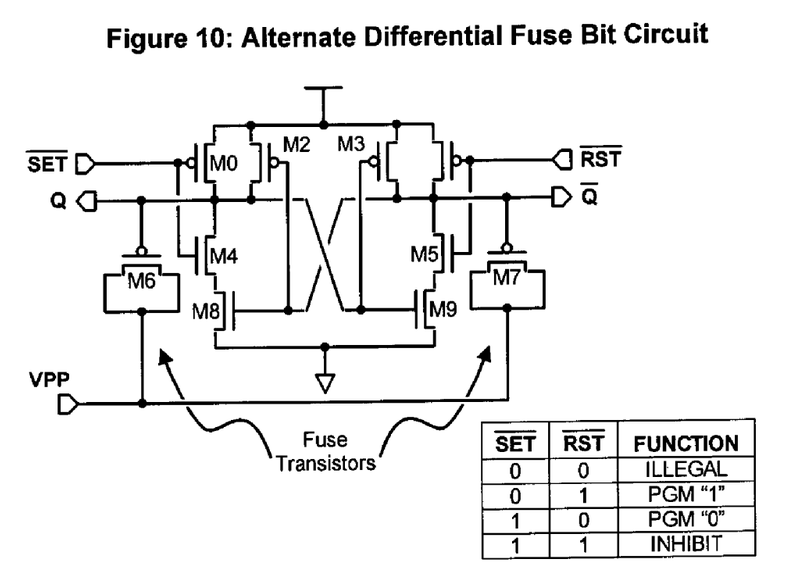
FIG. 10 illustrates an alternative differential fuse memory cell circuit, in accordance with yet another embodiment of the invention.

The alternative embodiment of FIG. 10 uses PMOS transistors as fuse elements (M6 and M7) rather than NMOS transistors. This construction overcomes the SET/RESET behavior of the embodiment depicted in FIG. 9. This alternative embodiment also provides the ability to keep the high voltage external to the low-voltage transistors via M6 and M7 devices. In this embodiment the VPP is applied to the source and drain, not to the gate, and therefore no isolation devices, such as M2 and M3 of FIG. 9, are necessary.

Figure 14:
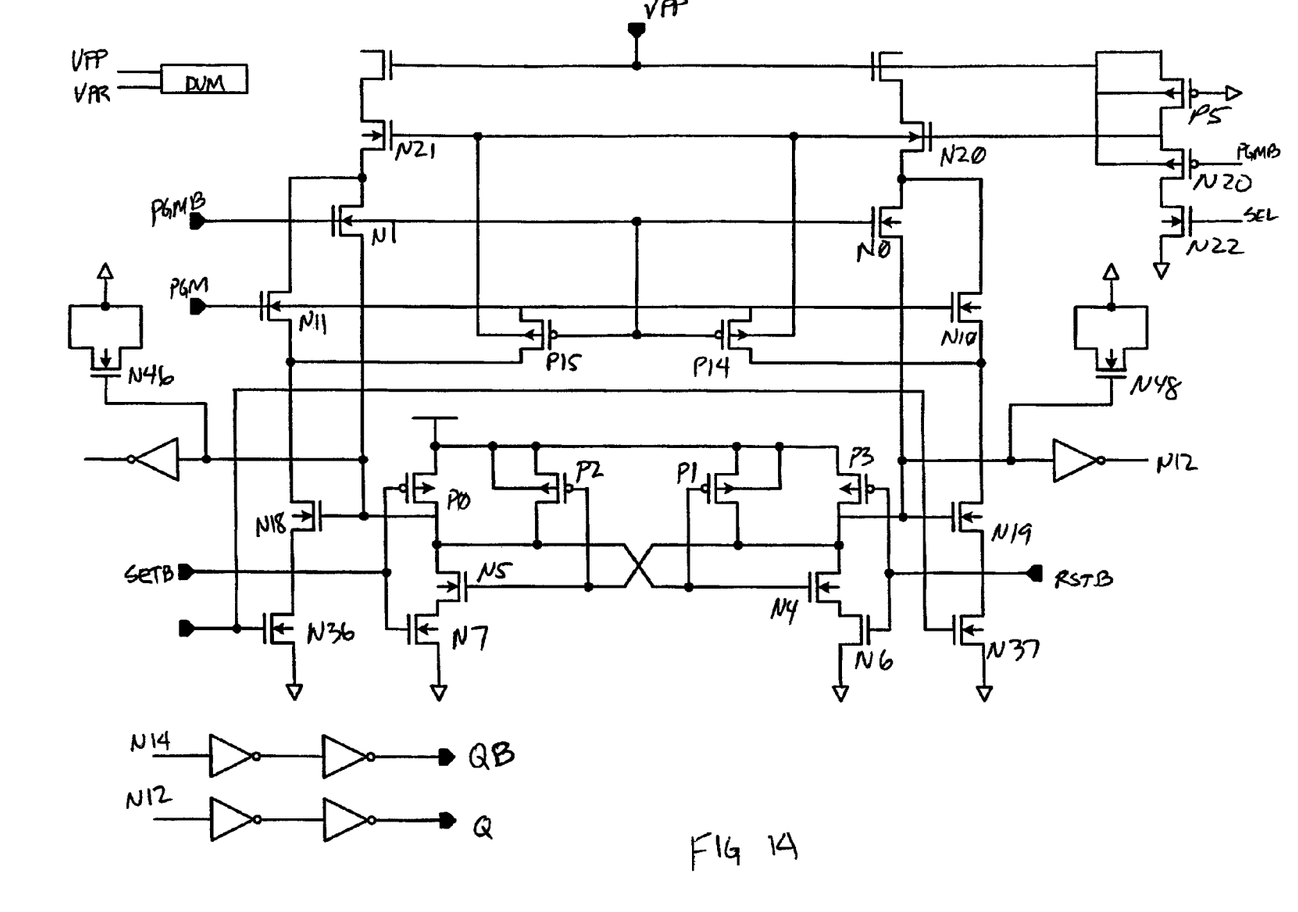
FIG. 14 illustrates an alternative variation of the circuit of FIG. 9.

FIG. 14 illustrates an alternative variation of the circuit of FIG. 9. In FIG. 14 the flop (mirror image circuit) consisting of P0, P1, P2, P3, N4, N5, N6, N7, is set or reset by setb or rstb lines, which is reflected at Q and QB outputs. Utilizing the set and reset options, a user can evaluate if a particular logic level is what the user wants, and can subsequently make it permanent by programming the circuit.

Suppose the flop is set so that Q=1, and QB=0. Then P3=0, and P0=1, sel and pgm are 1, pgmb is 0, and vpr is bias. Then VPP is elevated to it's highest voltage. The fuse oxide is ruptured and current flows through N21, N11, N18 (because P0=1), and N36 (which is the current limiter—there is a window of current for best programming). There is no path to ground for the other fuse, so it cannot be programmed and thereby has a high impedance. The programmed fuse has a much lower impedance.

Another advantage of this circuit is that, after it is programmed, it always comes up in the correct state during subsequent power ups. This is because the programmed fuse unbalances the flop and pulls up the programmed fuse side of the flop.

High-Voltage Tolerant Circuit

In the circuit of FIG. 8, a high-voltage level shifter X6 is provided to isolate a non-accessed fuse from the programming voltage when a different fuse in the same block is being programmed. This isolation is necessary due to the possibility of junction breakdown in the source/drain of the fuse transistor M0. Should the junction breakdown occur, it can provide a preferential path for excessive current flow to ground, which would cause poor cell characteristics. It can also cause excessive current drawn from the VPP supply when VPP is applied to a significant number of fuse transistors already programmed (i.e. conducting bits).

Figure 11:
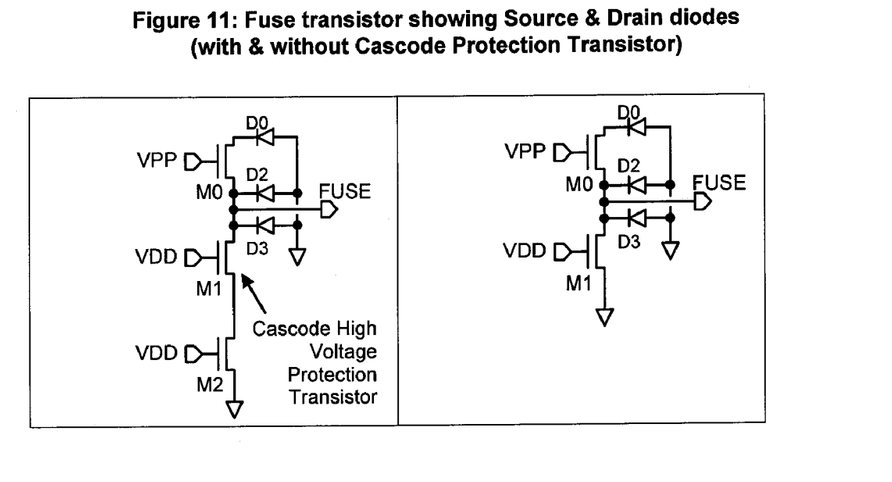
FIG. 11 shows source and drain details of fuse memory cell transistors.

If the source/drain junction of the fuse transistor M0 or of the select transistor M1 breaks down at a voltage equal to or below that of the oxide of M0, the mentioned situation will occur and undesired current will flow from VPP to ground via P-N Junction diodes D2 and D0 in FIG. 11, where D0 and D2 represent the drain and source diffusions, respectively, of transistor M0. And, diode D3 represents the drain diffusion of transistor M1. Each of these diodes has a breakdown voltage $BV_J$ (maximum reverse diode potential). If $BV_J$ of any of these diodes is equal to or less than $BV_{OX}$ (oxide breakdown voltage) of M0, VPP must be restricted to a small number of fuse transistors or the current from junction breakdown can exceed the maximum current capacity of the VPP supply. The solution is to increase the $BV_J$ of diodes D0, D2 and D3. To increase the $BV_J$ of diodes D0, D2 and D3, two methods are described below.

NWELL Junction Implant

Figures 12A, 12B:
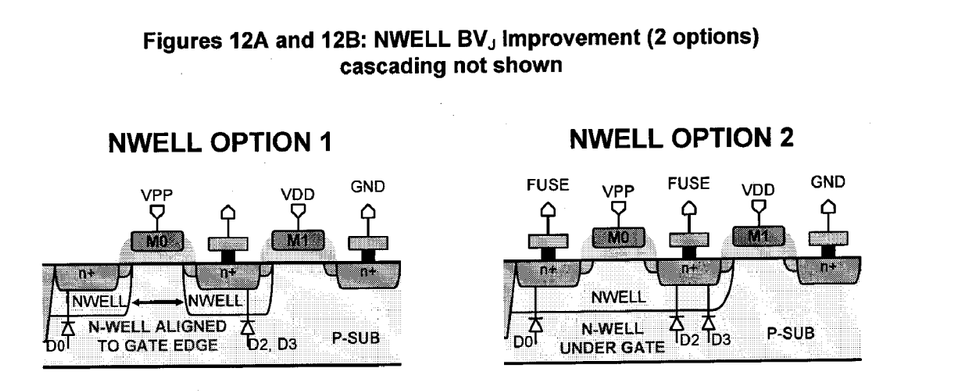
FIGS. 12A and 12B illustrate two options for CMOS implementation of a basic fuse memory cell, in accordance with other embodiments of the invention.

In two embodiments of this method, as shown in FIGS. 12A and 12B, N-type well implants, which are the same implants used for a standard PMOS transistor body, are co-implanted with the N+ Source/Drain implant. This creates a graded junction due to the presence of the NWELL implant. The method of FIG. 12B (NWELL under the poly) is an acceptable solution for this application because transistor action of M0 is not required. This class of solutions requires no extra masks or process steps, and increases the breakdown voltage of diodes D0, D2, and D3 to approximately 18V (in 0.18 μm CMOS process), which is much higher than $BV_{OX}$ of M0 and satisfies the desired criteria.

"NATIVE" Junction

Figure 13:
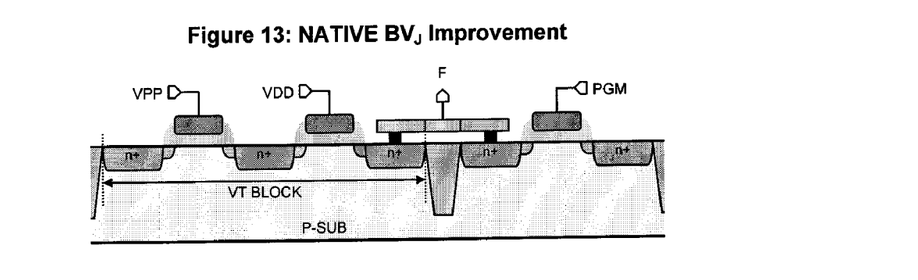
FIG. 13 illustrates another option for CMOS implementation of a basic fuse memory cell, in accordance with yet other embodiments of the invention.

FIG. 13 illustrates another option for CMOS implementation of a basic fuse memory cell, in accordance with yet other embodiments of the invention. In this method transistors M0 and M1 are made "Native", that is, the VT (VT is '0 ' or slightly negative) adjustment implant (PWELL) is blocked during processing. Again, no additional masking or processing steps beyond conventional CMOS is necessary. This procedure creates a P region beneath the transistor with a lower concentration than the standard P-Substrate, and therefore a higher $BV_J$.

Fuse-Block

Figure 15:
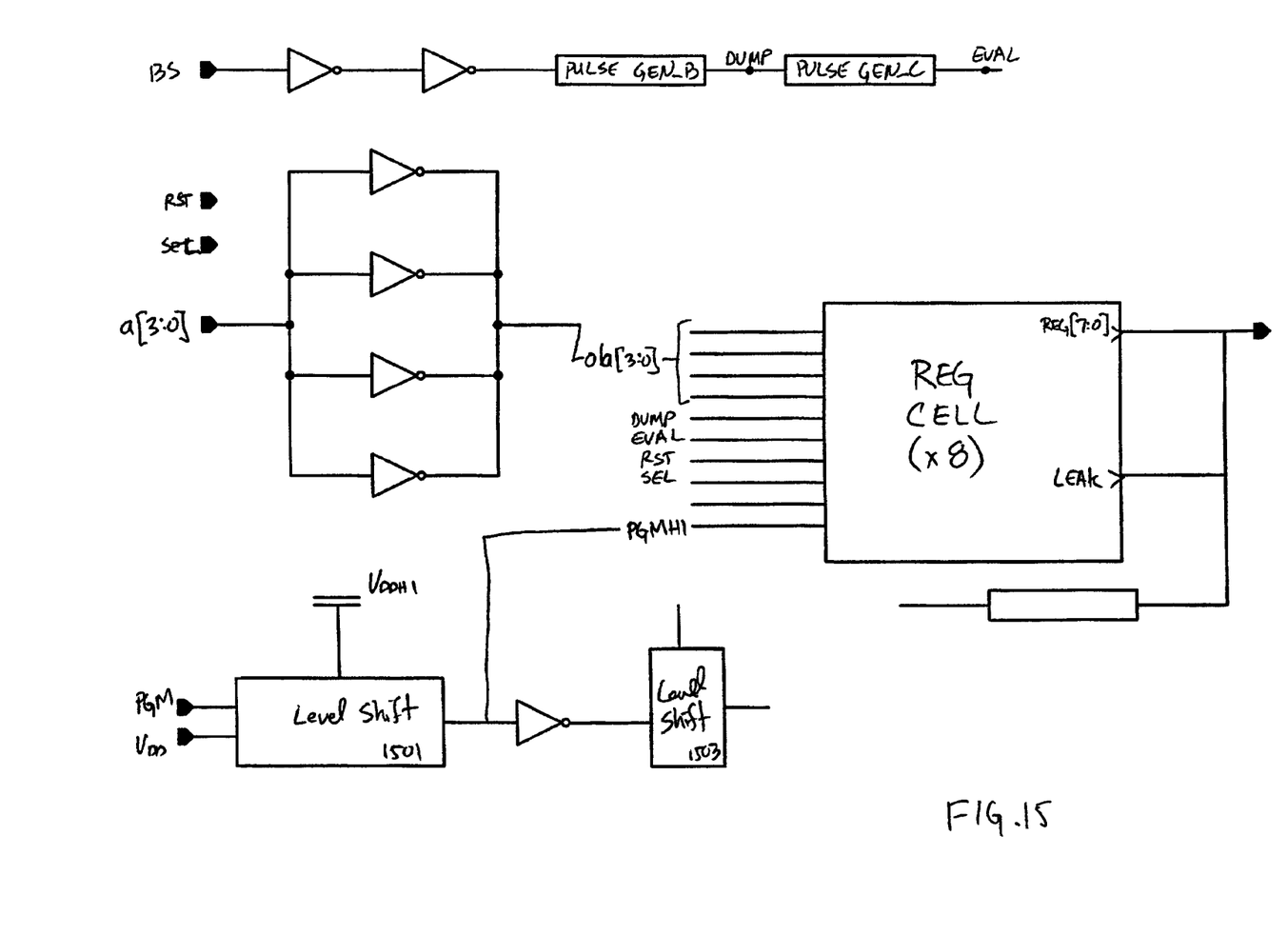
FIG. 15 is a high level block diagram of an 18-bit fuse-block using fuse memory cells, in accordance with an alternative embodiment of the invention.
Figure 16:
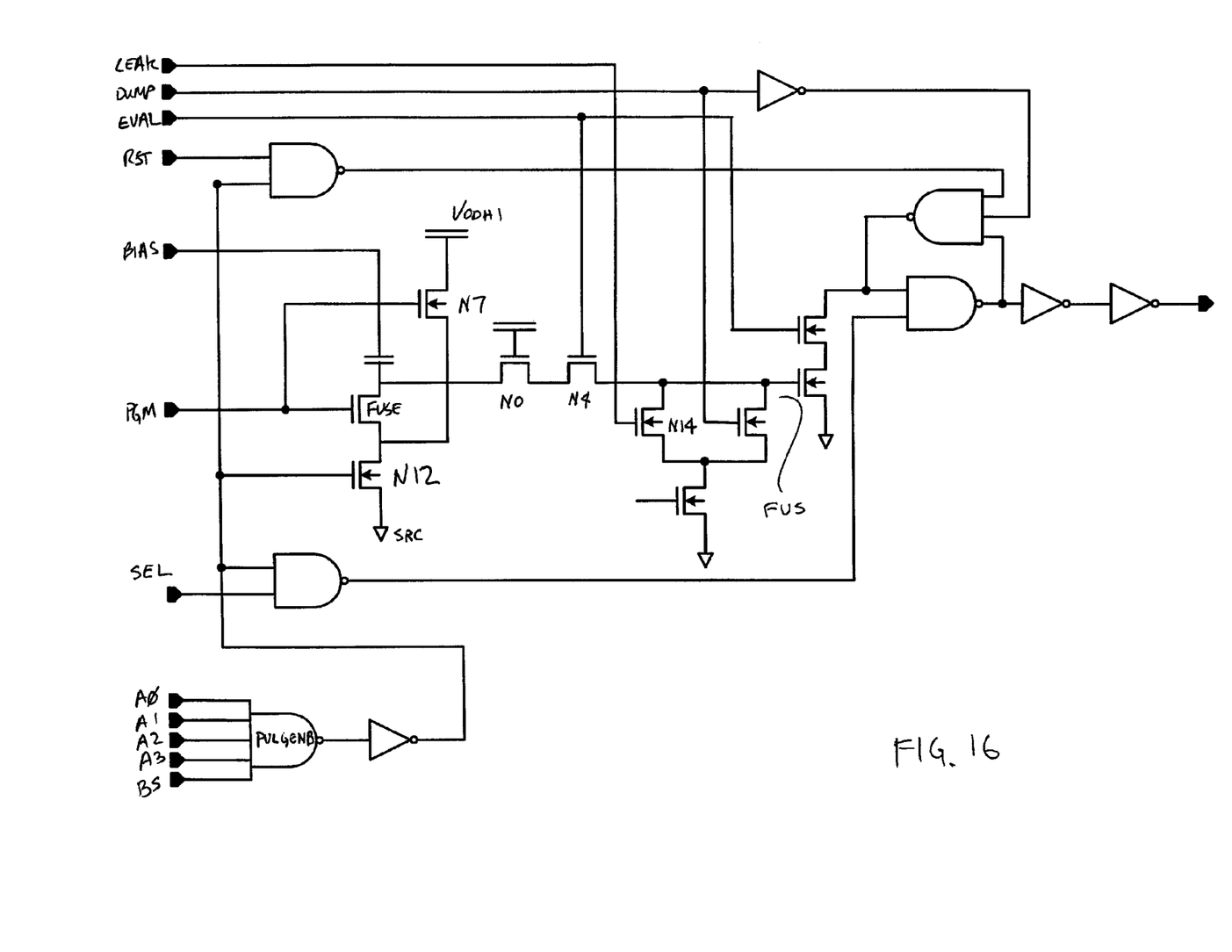
FIG. 16 illustrates the circuitry of the fuse-block of FIG. 15.

In another exemplary multi-bit memory embodiment, the fuse circuit consists of a cascadeable 8-bit fuse memory block ("fuse-block"), illustrated by the high level diagram of FIG. 15. Each illustrated fuse-block, like the fuse block shown in FIG. 4, has a pgm input pin that is used to program the fuse memory cells of that particular fuse-block. Furthermore, to program the fuse memory cells of the fuse-block, each fuse-block has an addressing circuit that employs the a[3:0] input pins. The pgm input pin allows for the cascading of multiple fuse-blocks with the ability to program any fuse memory cell within any fuse-block. The 8 output pins of each fuse-block, reg[7:0], are the latched outputs of the 8 memory bits (fuse memory cells) of the fuse-block. The purpose of the other pins shown in FIG. 15 will be discussed in detail when describing the inner circuitry of this shown in FIG. 15 will be discussed in detail when describing the inner circuitry of this fuse block which is illustrated by FIG. 16. While this example describes an 8-bit fuse memory block, other data word widths are extensions of this example.

FIG. 16 illustrates the circuitry of another embodiment of a fuse memory cell used in the fuse-block of FIG. 15. In the circuit of FIG. 16, an individual fuse XX is selected by a combination of the address pins a[3:0], bs, and pgm for programming or verifying. In one embodiment the fuse is a device such as a transistor. The fuse which has been selected for programming or verifying has its high voltage supplied by the "bias" input pin. In an alternative embodiment of this circuitry, the three-device memory cell MC is replaced by the two-transistor memory cell of FIG. 2.

The programming process occurs when (1) node "sel" is high, which ground node "src," (2) signal pgm is high (about 3.3v), and (3) signal "bias" is high (about 8.5v). This arrangement programs the fuse XX, wherein the programmed current will be limited by the impedance of device N12.

The read process for this circuit starts with a positive edge "bs" signal, which, among other things, enters the "pulgenb" block and creates a short width Vdd level signal called "dump." The dump signal discharges any leakage-buildup on node "fus" and resets the latch created by the two NAND-gates. Using the negative edge of dump signal, block pulgenb generates a wider Vdd level pulse "eval," which evaluates the voltage on node fus and sets the latch if fus is "1." eval is wide enough for mode fus so that there is enough time for fus to again charge up if fus has been programmed. Signal "leak" provides a small positive voltage to turn ON device N14 and ensure that node fus is clamped to ground when the fuse is not programmed.

Signal "bias" provides a high voltage for programming when input signal pgm is high and a lower voltage for reading when pgm is low. Block 1501 level shifts from Vdd (1.8v) to 3.3v when pgm is high and to 0v when pgm is low or signal vdd is low. Block 1503 outputs 8.5v if signal pgmhi is low and 1.8v if pgmhi is high.

Devices N0 and N4, which act as two series gates between the memory fuse and the memory cell latch, are intrinsic or native to reduce threshold drop from node "fuse" to node "fus." Device N7 is provided to cove a case where programming process has started but no cell has been selected yet. In alternative embodiments of the memory circuit of FIG. 16, some of the transistors and their functions may be omitted.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof.

Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

Changes can be made to the invention in light of the above Detailed Description. While the above description describes certain embodiments of the invention, and describes the best mode contemplated, no matter how detailed the above appears in text, the invention can be practiced in many ways. Details of the compensation system described above may vary considerably in its implementation details, while still being encompassed by the invention disclosed herein.

As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention

We claim:

1. A programmable read only memory circuit configured to be a part of a multi-bit memory block, the memory circuit comprising:
a single-bit core memory cell comprising at least a select device, a high-voltage protection device, and a fuse device in series, wherein data is programmed in the cell through permanently altering at least one physical characteristic of the fuse device by turning on the select device and applying a controlled high voltage to the gate of the fuse device for a predetermined period of time;
a single-bit latch for latching an output of the single-bit core memory cell or an externally provided data bit;
a set and a reset input line for controlling the single-bit latch content;
a block-select input line for selecting a memory block among a plurality of memory blocks;
multiple address input lines for selecting a memory circuit among a plurality of memory circuits of a memory block; and a programming input line for enabling programming of memory circuits of a selected memory block.

2. The memory circuit of claim 1, wherein the single-bit latch is essentially implemented by two cross-coupled NAND-gates.

3. The memory circuit of claim 2, wherein the fuse data passes at least through one transistor on the way to the single-bit latch, and wherein a signal at the transistor gate control the passage of the data.

4. The memory circuit of claim 2, wherein an input of the single-bit latch is connected to ground through two series transistor, wherein gate of one of the two series transistors is controlled by the fuse data.

5. The memory circuit of claim 4, wherein the transistor gate controlled by the fuse data is connected to ground by at least one leakage control transistor.

6. The memory circuit of claim 1, wherein the fuse device is a transistor, and wherein altering at least one physical characteristic of the fuse transistor is by breaking down dielectric or gate oxide of the fuse transistor.

7. The memory circuit of claim 1, wherein in a CMOS implementation of the core memory cell, N-type well implants are co-implanted with the N+ Source/Drain implant creating a graded junction due to the presence of the NWELL implant.

8. The memory circuit of claim 1, wherein in CMOS implementation of the core memory cell, the fuse and the select devices are "Native."

9. The memory circuit of claim 1, wherein the memory circuit is temporarily programmed, without breaking down the fuse device, by using the set and the reset input lines to temporarily store data into the single-bit latch.

10. The memory circuit of claim 1, wherein an individual memory circuit is selected for programming or verifying by a combination of address input lines, the block-select input line, and the programming input line.

11. A one-time programmable memory circuit comprising:
a single-bit core memory means for storing a single data bit, wherein the data bit is programmed in the memory means by permanently altering capacitance of a fuse device;
a single-bit latch means for latching an output of the single-bit core memory means or latching an externally provided data bit, wherein:
the single-bit latch is implemented by two cross-coupled NAND-gates;
the fuse data is connected to the single-bit latch through at least one transistor and a signal at the transistor gate controls the fuse data passage; and
an input of the single-bit latch is connected to ground through at least one transistor, a gate of which is controlled by the fuse data and is also connected to ground by at least one leakage control transistor;
a set and a reset means for controlling the single-bit latch content;
a block-select input means for selecting a block of multiple memory circuits among a plurality of memory circuit blocks;
multiple address input means for selecting a memory circuit among multiple memory circuits of a memory circuit block; and
a programming input means for enabling programming of memory circuits of a selected memory circuit block.

* * * * *